(12) United States Patent
Gaggl et al.

(10) Patent No.: US 7,002,404 B2
(45) Date of Patent: Feb. 21, 2006

(54) TUNING CIRCUIT FOR A FILTER

(75) Inventors: Richard Gaggl, Villach (AT); Manfred Nopp, Villach (AT); Peter Pessl, Nostl/Weiz (AT); Christian Schranz, Villach (AT); Dietmar Straussnigg, Villach (AT)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 10/773,710

(22) Filed: Feb. 6, 2004

(65) Prior Publication Data

US 2004/0169565 A1   Sep. 2, 2004

(30) Foreign Application Priority Data

Feb. 27, 2003  (DE) ................................ 103 08 527

(51) Int. Cl.
*H03K 5/00* (2006.01)
(52) U.S. Cl. .................................. 327/553; 327/552
(58) Field of Classification Search ......... 327/552–559
See application file for complete search history.

(56) References Cited

U.S. PATENT DOCUMENTS

| | | | | |
|---|---|---|---|---|
| 5,245,646 A * | 9/1993 | Jackson et al. | ................. | 377/2 |
| 5,418,492 A | 5/1995 | Wang et al. | | |
| 5,455,582 A * | 10/1995 | Valdenaire | .................... | 341/154 |
| 5,731,737 A * | 3/1998 | Cranford et al. | ............. | 327/553 |
| 5,914,633 A * | 6/1999 | Comino et al. | ............. | 327/553 |
| 5,982,228 A * | 11/1999 | Khorramabadi et al. | .... | 327/553 |
| 6,069,505 A * | 5/2000 | Babanezhad | ................ | 327/156 |
| 6,677,814 B1 * | 1/2004 | Low et al. | ................... | 327/554 |
| 6,781,433 B1 * | 8/2004 | Mori | ........................... | 327/337 |
| 6,842,710 B1 * | 1/2005 | Gehring et al. | ............. | 702/107 |
| 2002/0119753 A1 | 8/2002 | Digiandomenico et al. | | |

FOREIGN PATENT DOCUMENTS

DE      4433594        4/1995
DE      10050336 C1    7/2002

OTHER PUBLICATIONS

Tietze et al., "Halbleiter-Schaltungstechnik," Mit 1014 Abbildungen, Springer-Verlag 1983.

* cited by examiner

*Primary Examiner*—Dinh T. Le
(74) *Attorney, Agent, or Firm*—Jenkins, Wilson & Taylor, P.A.

(57) ABSTRACT

The invention relates to a tuning circuit for tuning a filter stage, which has an RC element (1) with an RC time constant ($\tau$), with the RC time constant ($\tau$) being the product of the resistance of a resistor (R1) in the RC element (1) and the capacitance of a capacitor (C1), which is connected in series with the resistor (R1), in the RC element (1), having a comparator (10) for comparison of the voltage which is produced at the potential node (4) between the resistor (R1) and the capacitor (C1), with a reference ground voltage; and having a controller (15) which varies the charge on the capacitor (C1) in the RC element (1) until the comparator (10) indicates that the voltage which is produced at the potential node (4) is equal to the reference ground voltage, with the controller (15) switching a capacitor array (26) as a function of the charge variation time, which capacitor array (26) is connected in parallel with the capacitor (C1) in the RC element (1), in order to compensate for any discrepancy between the RC time constant ($\tau$) of the RC element (1) and a nominal value.

16 Claims, 10 Drawing Sheets


TUNING CIRCUIT FOR A FILTER

TECHNICAL FIELD

The invention relates to a tuning circuit for a filter, in order to tune a filter stage.

BACKGROUND ART

As the amounts of data involved rise ever further, the frequency separations between individual transmission frequency bands become ever narrower. In consequence, ever more accurate analog anti-aliasing filters are required. For data transmission, the data from a data source is converted by means of a digital/analog converter to an analog transmission signal, and is transmitted to a receiver via a data transmission channel. In the receiver, the received data is converted to digital data by means of a digital/analog converter, for further data processing. The analog anti-aliasing filters prevent the analog/digital converter and digital/analog converter from injecting undesirable signal interference into the transmission signal. The filters are generally integrated on a semiconductor chip. The analog anti-aliasing filters contain RC elements which comprise resistors and capacitors. When the filters are integrated on a semiconductor chip, process discrepancies occur during the production process, so that the resistance and capacitance values of the RC elements contained in the filter may not be the same as the desired nominal value. The time constant ($\tau$) of an RC element is the product of the resistance R of the resistor and the capacitance C of the capacitor within the RC element. The cut-off frequency $f_g$ of a filter stage with an RC element depends on the RC time constant of the filter stage. The cut-off frequency $f_g$ of the associated filter stage therefore also varies as a result of fluctuations in the resistances and capacitances.

In order to avoid any fluctuation in the cut-off frequency $f_g$ of the filter stage, the filters are therefore tuned or trimmed after production.

FIGS. 1a to 1c show various possible ways for indirect tuning or for trimming of filters.

In FIG. 1a, an on-chip resistor $R_0$, which, for example, is in the form of an MOS transistor, is compared by means of a comparison circuit with an external high-precision resistance $R_{ext}$. The value of the on-chip resistor $R_0$ is automatically readjusted by means of a monitoring voltage $V_c$ until the on-chip resistor $R_0$ has precisely the same value as the high-precision external resistance $R_{ext}$.

In the arrangement as illustrated in FIG. 1b, a reference filter is used which has the same circuitry as the main filter that is to be adjusted. A sinusoidal signal is fed into the reference filter, and a phase comparator continuously compares the phase at the output of the main filter with that of the sinusoidal signal. The monitoring voltage $V_c$ is readjusted until the desired phase value is reached.

A further possible way to carry out trimming according to the prior art comprises, as is illustrated in FIG. 1c, the use of an oscillator as a reference circuit. This oscillator is formed from the same circuit elements as the main filter. A comparison circuit compares the phase angle of the output signal emitted from the oscillator with that of the injected sinusoidal signal.

A monitoring voltage is readjusted until the desired phase value is reached.

The tuning methods that are illustrated in FIGS. 1a to 1c are based on tight matching of components on the chip, which are at a very short distance from one another.

FIG. 2 shows a so-called biquad filter according to the prior art. Biquad filters are second-order analog filters which are completely differential and contain two filter stages. Each filter stage in the biquad filter illustrated in FIG. 2 has an RC element, in each case comprising a resistor R and a capacitor C. The resistances and capacitances are subject to manufacturing tolerances after the production process. These manufacturing tolerances may, for example, be plus/minus 20% in the case of capacitors, and plus/minus 15% in the case of resistors. These production discrepancies result in the time constants ($\tau = R \times C$) of the various filter stages varying widely, and in the cut-off frequencies $f_g$ being shifted. This in turn leads to a change in the respective cut-off frequency $f_g$ of the filter. During the integration of the second-order biquad filter as illustrated in FIG. 2 and according to the prior art, this filter must therefore be trimmed or tuned.

FIG. 3 shows a block diagram of a circuit arrangement for trimming a filter according to the prior art. Conventional tuning and trimming circuits are integrated on the chip, as an autonomous circuit block. This separate trimming circuit is located on the same chip as the analog filter to be tuned and as the other functional circuit components. The trimming circuit according to the prior art essentially comprises an analog circuit for measurement of the RC time constant ($\tau$) of a filter stage within the filter, and a digital circuit for evaluation of the measured time constant $\tau$. The analog RC measurement circuit within the separate trimming circuit is a circuit arrangement which is identical to the filter stage, which is to be measured and to be trimmed, within the filter. The digital circuit part of the trimming circuit evaluates the measured time constant $\tau$ of the filter stage and switches a capacitor array, which is provided in the filter, in order to compensate for any discrepancy between the RC time constant and a nominal value.

The circuit arrangement as illustrated in FIG. 3 and according to the prior art for trimming of an analog filter has considerable disadvantages. The trimming circuit is arranged on the chip separately from the filter to be trimmed. Since the trimming circuit contains a model of the circuitry of the filter stage to be trimmed, it requires virtually just as much space during integration on the chip as the filter to be trimmed itself. The additional space required leads to considerably higher production costs for the overall chip.

Since the trimming circuit is integrated on the chip separately from the filter to be trimmed, this results in a physical separation between the RC elements within the filter stage to be trimmed and the RC elements within the trimming circuit, which identically model the filter stage. The physical separation means that, from a circuitry point of view, good matching between the impedances of the capacitors within the filter to be trimmed and between the impedances of the capacitors within the RC measurement circuit which is contained in the trimming circuit can be achieved only with difficulty. Manufacturing differences and temperature gradients may lead to the RC elements within the trimming circuit and within the filter stage to be trimmed having a different behavior. This in turn results in the filter stage being tuned or trimmed incorrectly.

SUMMARY OF THE INVENTION

The object of the present invention is therefore to provide a tuning circuit for tuning a filter stage, which occupies as little space as possible during integration and which ensures a high degree of accuracy in the tuning of the filter stage.

According to the invention, this object is achieved by a tuning circuit having the feature specified in patent claim 1 and by a method for tuning having the feature specified in patent claim 16.

The invention provides a tuning circuit for tuning a filter stage, which has an RC element with an RC time constant ($\tau$), with the RC time constant ($\tau$) being the product of the resistance of a resistor (R1) in the RC element and the capacitance of a capacitor (C1), which is connected in series with the resistor (R1), in the RC element, having a comparator for comparison of the voltage which is produced at the potential node between the resistor (R1) and the capacitor (C1), with a reference ground voltage, and having a controller which varies the charge on the capacitor (C1) in the RC element until the comparator indicates that the voltage which is produced at the potential node is equal to the reference ground voltage, with the controller switching a capacitor array as a function of the charge variation time, which capacitor array is connected in parallel with the capacitor (C1) in the RC element, in order to compensate for any discrepancy between the RC time constant ($\tau$) of the RC element and a nominal value.

The basic idea of the tuning circuit according to the invention is to integrate the tuning circuit in the filter to be trimmed itself, in particular in order to use the capacitors that are already in the filter to be tuned for tuning of the filter stage.

Since the capacitors which are used for the tuning circuit are identical to those in the filter stage to be tuned, there is a perfect match between the capacitors, so that the tuning can be carried out with high precision. Furthermore, no additional space need be provided for capacitors for the trimming circuit, so that the total space that is required for the trimming circuit is small.

In one preferred embodiment of the tuning circuit according to the invention, the filter stage is tuned in an integrated analog filter.

In one preferred embodiment of the tuning circuit according to the invention, the controller has a sequence controller for driving switches which are provided for varying the charge on the capacitor in the RC element.

The switches are preferably integrated in the analog filter.

The switches are preferably CMOS switches.

The sequence controller in one preferred embodiment has a digital counter for measurement of the charge variation time.

In this case, the digital counter for the sequence controller is preferably clocked by an external clock signal.

The digital counter for the sequence controller preferably counts the number of clock cycles of the external clock signal between reception of a start signal and reception of a stop signal, which is received from the comparator.

The controller in one preferred embodiment has a memory which is connected to the sequence controller.

A coded tuning control signal for switching the capacitor array is preferably stored in the memory for each count of the digital counter.

The capacitor array in one preferred embodiment of the tuning circuit according to the invention has two or more tuning capacitors, which are connected in parallel with the capacitor in the RC element as a function of the coded tuning control signal.

The capacitances of the tuning capacitors are preferably weighted multiples of a basic capacitance.

The capacitor array in one preferred embodiment of the tuning circuit according to the invention is integrated in the filter stage.

The integrated analog filter can preferably be switched between a normal filter mode and a tuning mode by means of switches which are driven by the sequence controller.

The filter stage preferably has a completely differential operational amplifier.

The completely differential operational amplifier preferably has a first signal input which is connected to a potential node in a first RC element, a second signal input which is connected to the potential node in a second RC element, a first signal output which is fed back via the capacitor in the first RC element to the first signal input, and a second signal output which is fed back via the capacitor in the second RC element to the second signal input.

In this case, the capacitor in the first RC element is preferably charged by means of switches which are controlled by the sequence controller, and the capacitor in the second RC element is discharged by means of switches which are controlled by the sequence controller, until the voltages which are produced at the potential nodes in the two RC elements are of equal magnitude.

The comparator preferably has a first signal input which is connected to the potential node in the first RC element, a second signal input which is connected to the potential node in the second RC element, and an output for emitting a stop signal to the sequence controller when the voltage which is applied to the first signal input is equal to the voltage which is applied to the second signal input.

The counter which is contained in the sequence controller preferably records the time until the voltages which are applied to the two signal inputs of the comparator are of equal magnitude.

In one preferred embodiment of the tuning circuit according to the invention, the filter stage has an operational amplifier whose first signal input is connected to the potential node in the RC element and whose signal output is fed back via the capacitor in the RC element to the signal input.

In this case, the comparator preferably has a first signal input, which is connected to the signal output of the operational amplifier, a second signal input, to which the reference ground voltage is applied, and an output for emitting a stop signal, to the sequence controller, when the voltage which is applied to the first input is equal to the reference ground voltage.

The second input of the comparator is preferably alternatively connected by means of switches which are controlled by the sequence controller to a first reference voltage source which generates a first reference voltage, or to a second reference voltage source which generates a second reference voltage.

The capacitor in the RC element is preferably alternatively connected by means of switches which are controlled by the sequence controller to the first reference voltage source in order to discharge the capacitor, or to the second reference voltage source in order to charge the capacitor.

The capacitor preferably has its charge varied by means of the switches which are controlled by the sequence controller, until the first reference voltage is applied to the first input of the comparator, and the capacitor then has its charge varied in the opposite direction by means of the switches which are controlled by the sequence controller, until the second reference voltage is once again applied to the first input of the comparator.

The counter which is contained in the sequence voltage preferably records the overall time for the charge variation and for the opposite charge variation of the capacitor.

An anti-aliasing filter is preferably used for the analog filters.

The analog filter is preferably an XDSL anti-aliasing filter.

In one preferred embodiment, the analog filter is a biquad filter.

In one particularly preferred embodiment, the analog filter is completely differential.

The analog filter preferably has two or more filter stages.

The invention also provides a method for tuning a filter stage which contains an RC element with an RC time constant, with the RC time constant ($\tau$) being the product of the resistance of a resistor (R1) in the RC element and the capacitance of a capacitor (C1), which is connected in series with the resistor (R1), in the RC element, with the method having the following steps, specifically variation of the charge on the capacitor (C1) by at least one RC element in the filter stage, measurement of the charge variation time until the voltage which is produced at the potential node between the resistor (R1) and the capacitor (C1) in the RC element reaches a reference ground voltage, switching a capacitor array, which is connected in parallel with the capacitor (C1) in the RC element, as a function of the measured charge variation time, in order to compensate for any discrepancy between the RC time constant ($\tau$) of the RC element and a predetermined nominal value ($\tau_{NOM}$).

The capacitor in the RC element is preferably charged to a specific first reference ground voltage before the tuning of the filter stage.

In one preferred embodiment of the method according to the invention, in order to tune the filter stage, the charge on the capacitor is varied until the voltage which is dropped across the capacitor is equal to a second reference ground voltage, and it is then charged in the opposite direction until the voltage which is dropped across the capacitor is once again equal to the first reference ground voltage.

In this case, the two charge variation times for varying the charge on the capacitor are preferably measured as an overall time.

In one preferred embodiment of the method according to the invention, a capacitor in a first RC element is charged to a first reference ground voltage before the tuning of the filter stage, and a capacitor in a second RC element is charged to a second reference ground voltage before the tuning of the filter stage, with the capacitor in the first RC element being discharged, and the capacitor in the second RC element being charged, until the voltage across the two capacitors is of equal magnitude.

In this case, the charge variation time until the two voltages across the two capacitors are of equal magnitude is preferably measured.

BRIEF DESCRIPTION OF THE DRAWINGS

Preferred embodiments of the tuning circuit according to the invention and of the tuning method according to the invention will be described in the following text in order to explain features that are significant to the invention, with reference to the attached figures, in which.

DETAILED DESCRIPTION OF THE INVENTION

Figure 4:
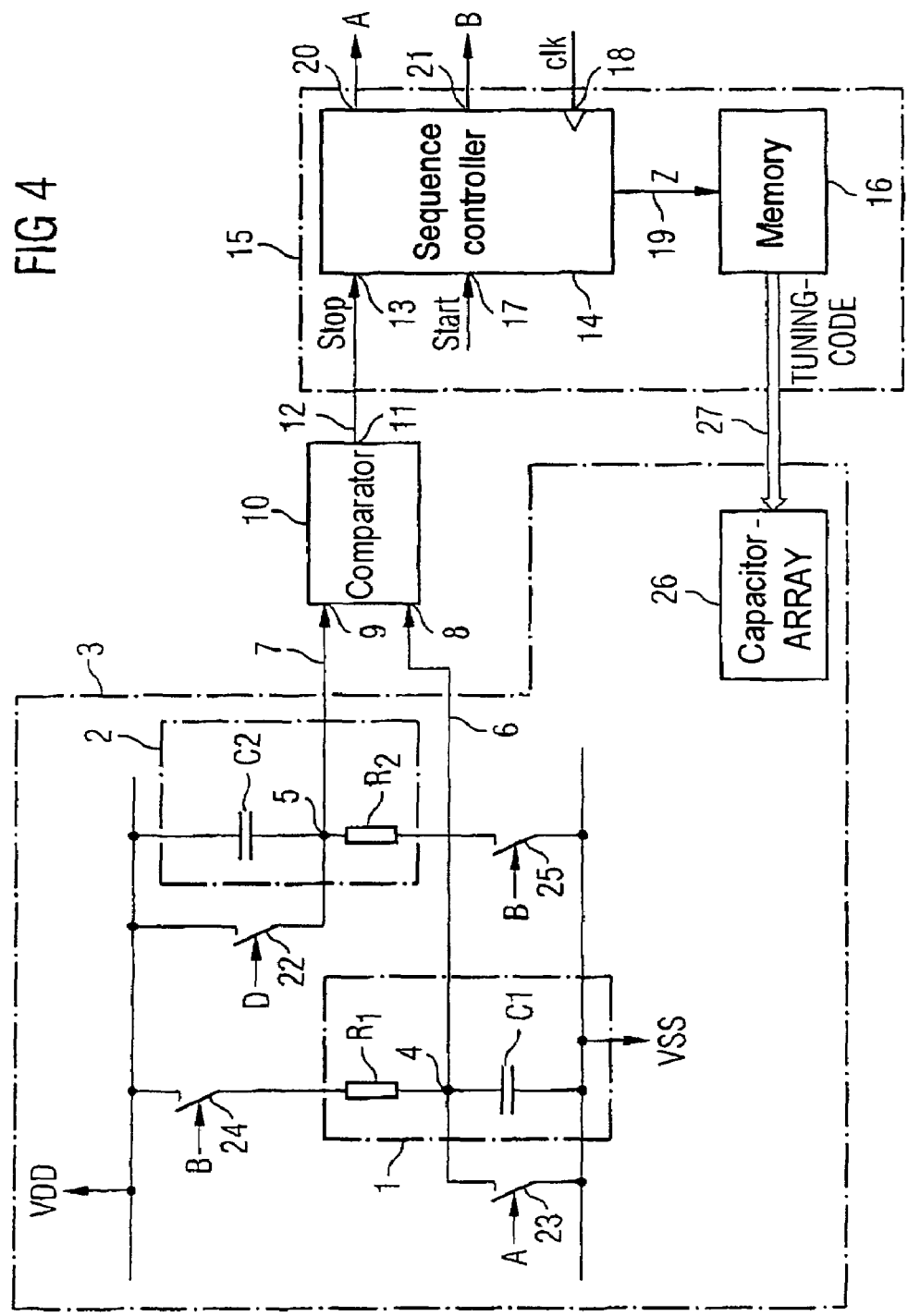
FIG. 4 shows a block diagram in order to explain the trimming process for a first embodiment of the tuning circuit according to the invention.

FIG. 4 shows a circuit arrangement in order to explain a first embodiment of the tuning circuit according to the invention. A filter 3 to be tuned contains a first RC element 1 and a second RC element 2. The filter 3 has further circuit components, which are not illustrated in FIG. 4, in addition to the first and second RC elements. The filter 3 is supplied with voltage by means of a positive supply voltage $V_{dd}$ and by means of a negative supply voltage $V_{ss}$. The first RC element 1 comprises a resistor R1 and a capacitor C1, which is connected in series with it. In the same way, the second RC element 2 comprises a capacitor C2 and a resistor R2, which is connected in series with it. A connecting node 4 within the first RC element 1, at which the resistor R1 and the capacitor C1 in the RC element 1 are connected to one another, and a connecting node 5 within the second RC element 2, at which the capacitor C2 in the second RC element 2 and the resistor R2 in the second RC element 2 are connected to one another, are connected via lines 6, 7 via a first and a second signal input 8, 9 of a comparator 10. The comparator 10 compares the voltage which is produced at the first potential node 4 with the voltage which is produced at the second potential node 5. The comparator 10 has an output 11 which is connected via a control line 12 to an input 13 of a sequence controller 14. The sequence controller 14 is part of a controller 15 which, in addition to the sequence controller 14, also contains a memory 16. The sequence controller 14 has a digital counter. Via a control input 17, the sequence controller 14 receives an external start signal in order to start a tuning process for the filter 3. The counter which is contained in the sequence controller 14 measures the time between the received start signal and a stop signal which is emitted from the comparator 10. For this purpose, the sequence controller 14 is clocked by means of a clock signal CLK which is applied to a clock input 18. The digital counter counts the number of clock cycles between the start signal and the stop signal. The count Z is emitted via lines 19 to a look-up table which is contained in the memory 16.

Via control lines, the sequence controller 14 drives switches which are provided in the filter 3, in order to tune the filter. In the embodiment shown in FIG. 4, the sequence controller emits a first control signal A via a control output 20, and a second control signal B via a second control output 21. The control signal A drives the switches 22, 23 within the filter 3. The control signal B drives the switches 24, 25 within the filter 3.

Before the sequence controller 14 contains the start signal for starting the tuning process via the control input 17, the switches 22, 23 are closed on the basis of the control signal A, and the switches 24, 25 are opened on the basis of the control signal B. In consequence, the capacitor C1 in the first RC element 1 is completely discharged before the start of the tuning process, and the capacitor C2 within the second RC element 2 is completely charged. Once the sequence controller 14 has received the start signal in order to start the tuning process, the switches 22, 23 are opened, and the switches 24, 25 are closed. This results in the capacitor C1 within the first RC element 1 being charged, and in the capacitor C2 within the second RC element 2 being discharged. The comparator 10 compares the voltages which are produced at the voltage potential nodes 4, 5, and emits a stop signal via the control line 12 to the sequence controller 14 as soon as the two voltages have the same magnitude. The sequence controller 14 measures the charge variation time of the clocked digital counter, and emits the count Z to the memory 16. The memory 16 contains a stored table in which a coded tuning control signal is stored for each count. The tuning control signal comprises two or more coded control signal bits $Z_i$ for switching two or more switches within a capacitor array 26. The capacitor array 26 comprises two or more capacitors, which are connected in parallel with the capacitors C1, C2 to be tuned within the filter 3. The capacitor array 26 is integrated in the filter 3. The capacitor array 26 is driven via control lines 27 on the basis of the read coded tuning control signal. The RC elements 1, 2 are RC elements in a filter stage within the filter 3. In addition to the filter stage to be tuned, the filter 3 may also contain further filter stages. The sequence controller 15 varies the charge on the capacitor C1 in the RC element 1 until the comparator 10 indicates that the voltage which is produced at the potential node 4 is equal to a reference ground voltage, namely is equal to the comparison voltage which is produced at the potential node 5. The controller 15 switches a capacitor array 26, which is connected in parallel with the capacitor C1 in the RC element 1, as a function of the charge variation time as measured by the digital counter, in order to compensate for manufacturing discrepancies between the RC time constant τ of the RC element 1 and the nominal value.

Figure 5:
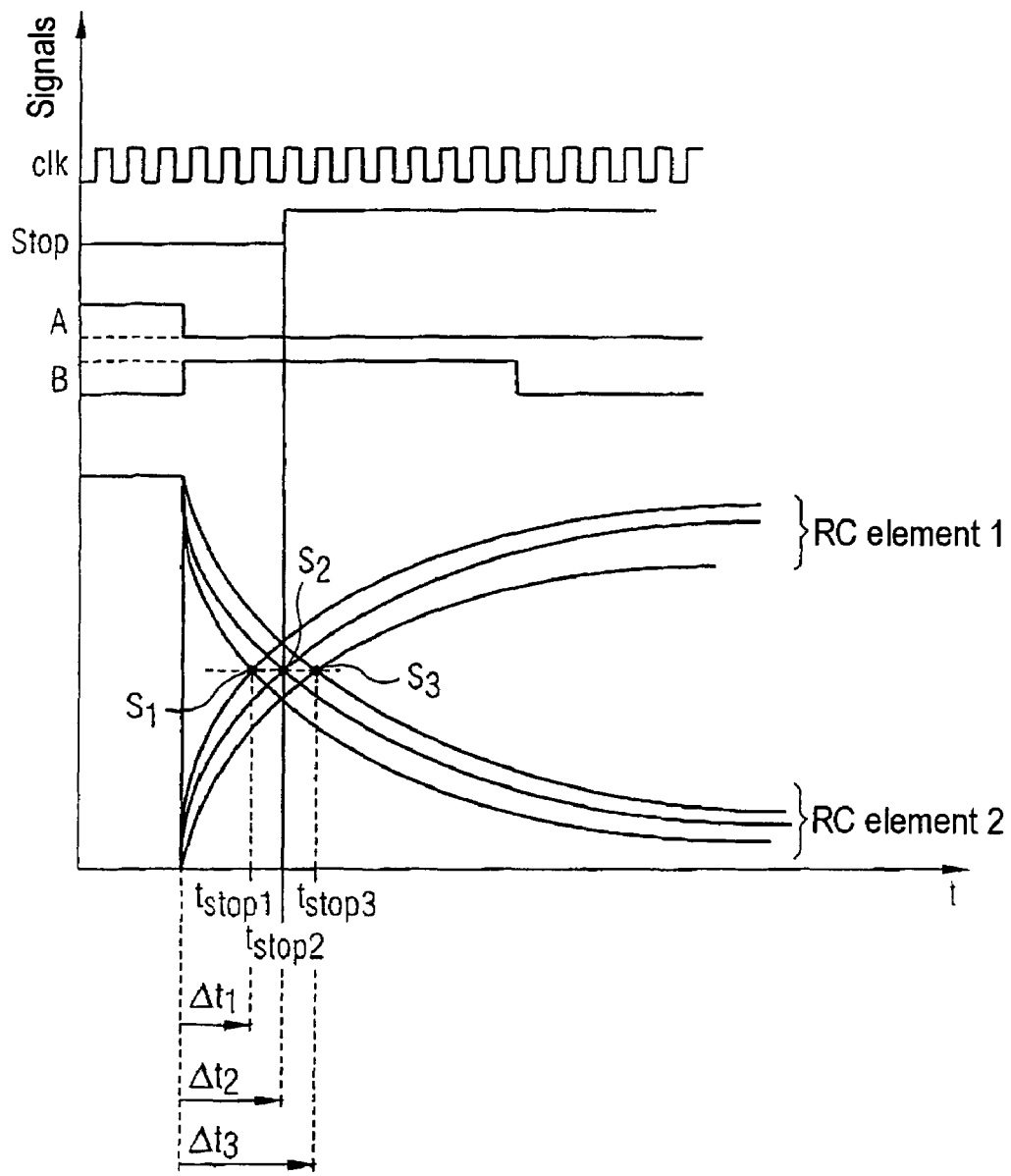
FIG. 5 shows signal flowcharts in order to explain the method of operation of the circuit arrangement according to the invention as illustrated in FIG. 4.

FIG. 5 shows the signal profiles of the circuit arrangement illustrated in FIG. 4. The tuning process starts at the time $t_{start}$, with the control signal A opening the switches 22, 23 and the control signal B closing the switches 24, 25. As is illustrated in FIG. 5, the RC element 1 is charged as a function of the RC time constant $\tau_1 = R1 \times C1$. The second RC element 2 is discharged in the same way with the time constant $\tau_2 = R2 \times C2$. By way of example, FIG. 5 shows three profiles for each RC element for different time constants $\tau_1$ and $\tau_2$, showing 3 different intersections $S_1$, $S_2$, $S_3$. If the supply voltage varies, the charging and discharge curves of the two RC elements are shifted in the same direction, so that the intersection is shifted vertically in the diagram, without the measuring time Δt being changed. The measurement circuit is thus extremely stable with respect to voltage fluctuations in the supply voltage. After receiving the start signal, the digital counter within the sequence controller 14 counts, clocked by the clock signal CLK, the number of clock pulses between the received start signal and the stop signal that is emitted from the comparator.

$$\Delta t = t_{CLK} \times N = LN(2) \times R \times C$$

Figure 6:
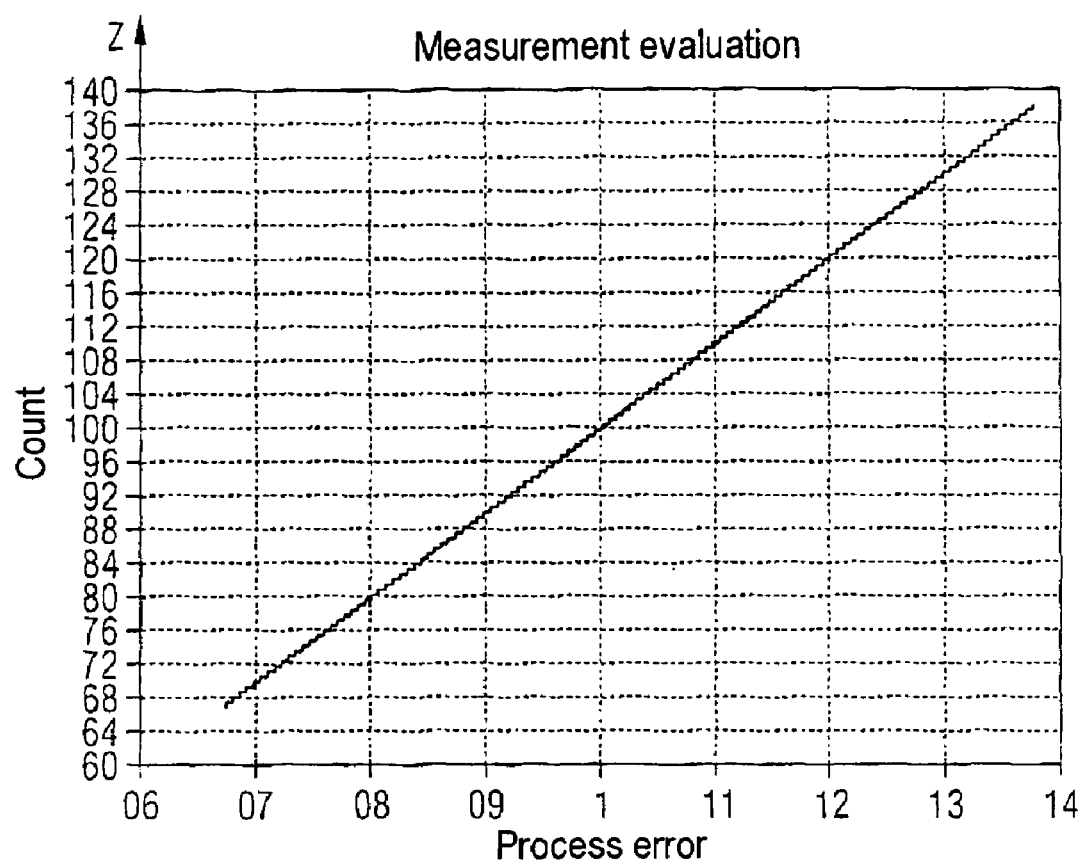
FIG. 6 shows a diagram in order to explain the method of operation of the tuning circuit according to the invention as illustrated in FIG. 4.

By way of example, FIG. 6 shows the count Z of the counter within the sequence controller 14 as a function of the process discrepancy. If the process discrepancy is normalized with respect to unity, the count is, for example, 100. The normalized process discrepancy 1 corresponds to the nominal value, that is to say the RC time constant τ corresponds precisely to the desired RC time constant $\tau_{NOM}$. The greater the process discrepancy from the desired nominal value, the greater is the discrepancy between the count and the desired nominal count of Z=100.

Figure 7:
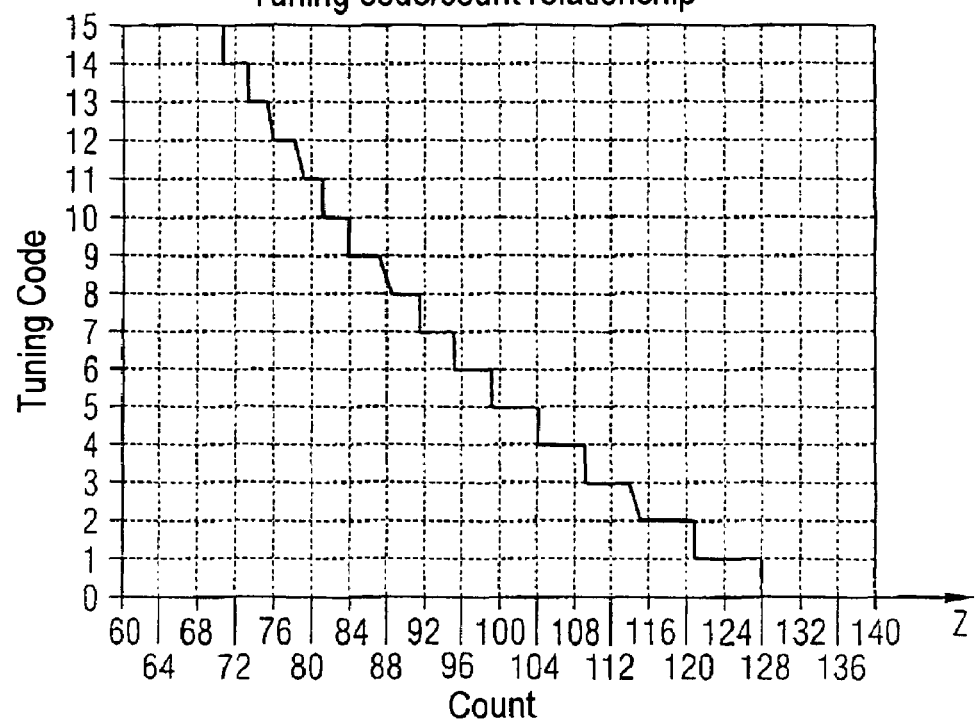
FIG. 7 shows a diagram in order to explain the method of operation of the tuning circuit according to the invention as illustrated in FIG. 4.

FIG. 7 shows an example of a tuning code as a function of the count. In the example illustrated in FIG. 7, the tuning code comprises four tuning control bits, which can be used to represent values between 0 and 15. When the count is 100, the tuning control code is, for example, 5, which corresponds to the bit sequence 0101 in binary-coded form. The tuning control signal is read from the memory 16 to a capacitor array 26 in the filter 3 via the control lines 27 which, in the chosen example, comprise four control lines.

Figure 8:
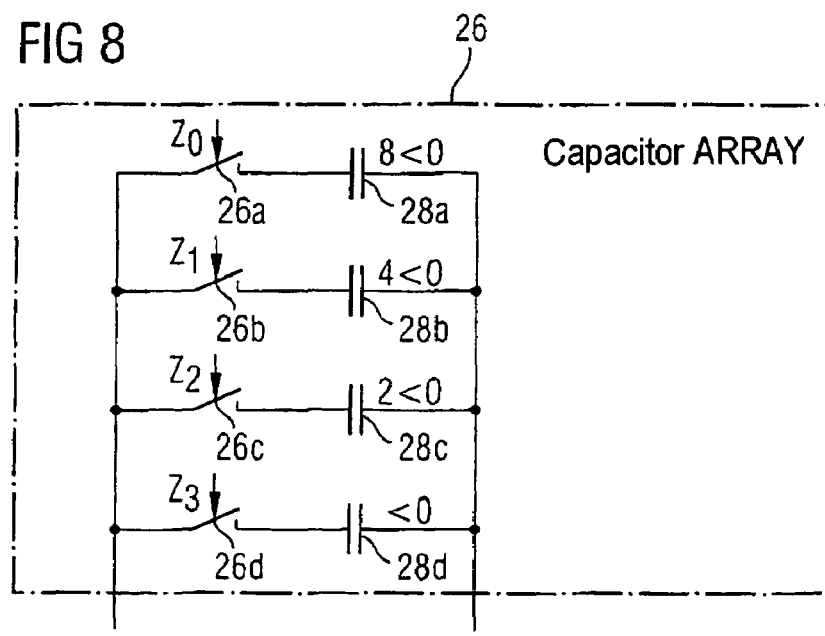
FIG. 8 shows a circuit arrangement of a capacitor array which is used in the tuning circuit according to the invention.

The four control bits $Z_0$, $Z_1$, $Z_2$, $Z_3$ control the switches 26a, 26b, 26c, 26d, which are illustrated in FIG. 8, within the capacitor array 26. The capacitor array 26 contains two or more parallel-connected capacitors 28a, 28b, 28c, 28d, which can be connected in parallel via the switches 26a, 26d. Each of the tunable capacitors C1, C2 within the filter 3 has an associated capacitor array which makes it possible to vary the RC time constant of the RC element 1 or of the RC element 2, and the controller 15. The controller 15 connects the capacitors 28a to 28d in the capacitor array 26 to the associated capacitor within the filter 3 as a function of the measured charge variation time, in order to compensate for the discrepancies between the RC time constant of the RC element and a nominal value $\tau_{NOM}$, which result from the production process. The procedure illustrated in FIG. 4 has the advantage that the trimming process is carried out independently of voltage influences. The process discrepancy is the one and only factor that influences the measurement result of the time constant τ. The capacitance array 26 that is illustrated in FIG. 8 has two or more tuning capacitors 28a to 28d, which are preferably more weighted multiples of a basic capacitance $C_{basic}$. N tuning capacitors make it possible to set $2^N$ different states and capacitance values in order to compensate for process fluctuations. If N has four bits, this results in 16 different capacitance values.

Figure 1:
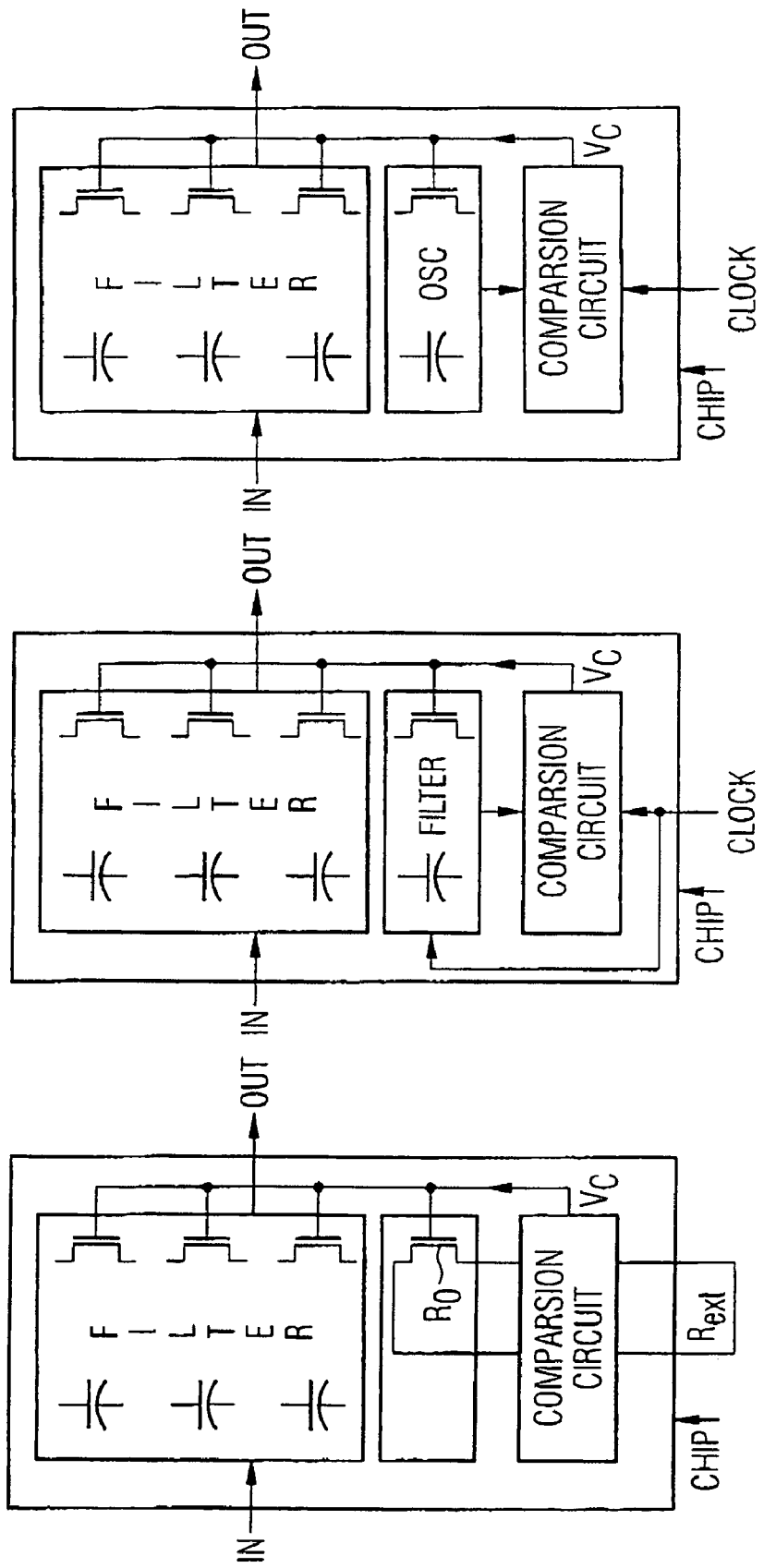
FIG. 1 shows various circuit arrangements for tuning filters according to the prior art.
Figure 2:
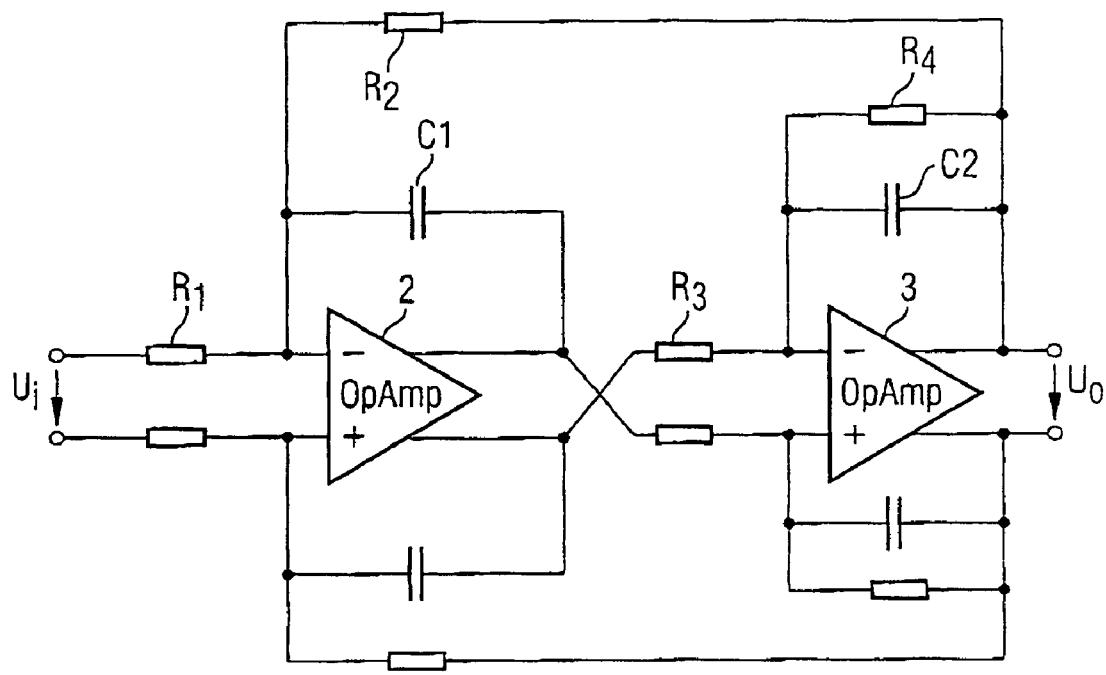
FIG. 2 shows a second-order biquad filter according to the prior art.
Figure 3:
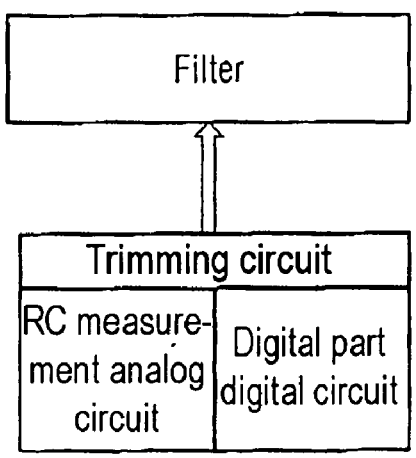
FIG. 3 shows a block diagram of a circuit arrangement for trimming a filter according to the prior art.
Figure 9:
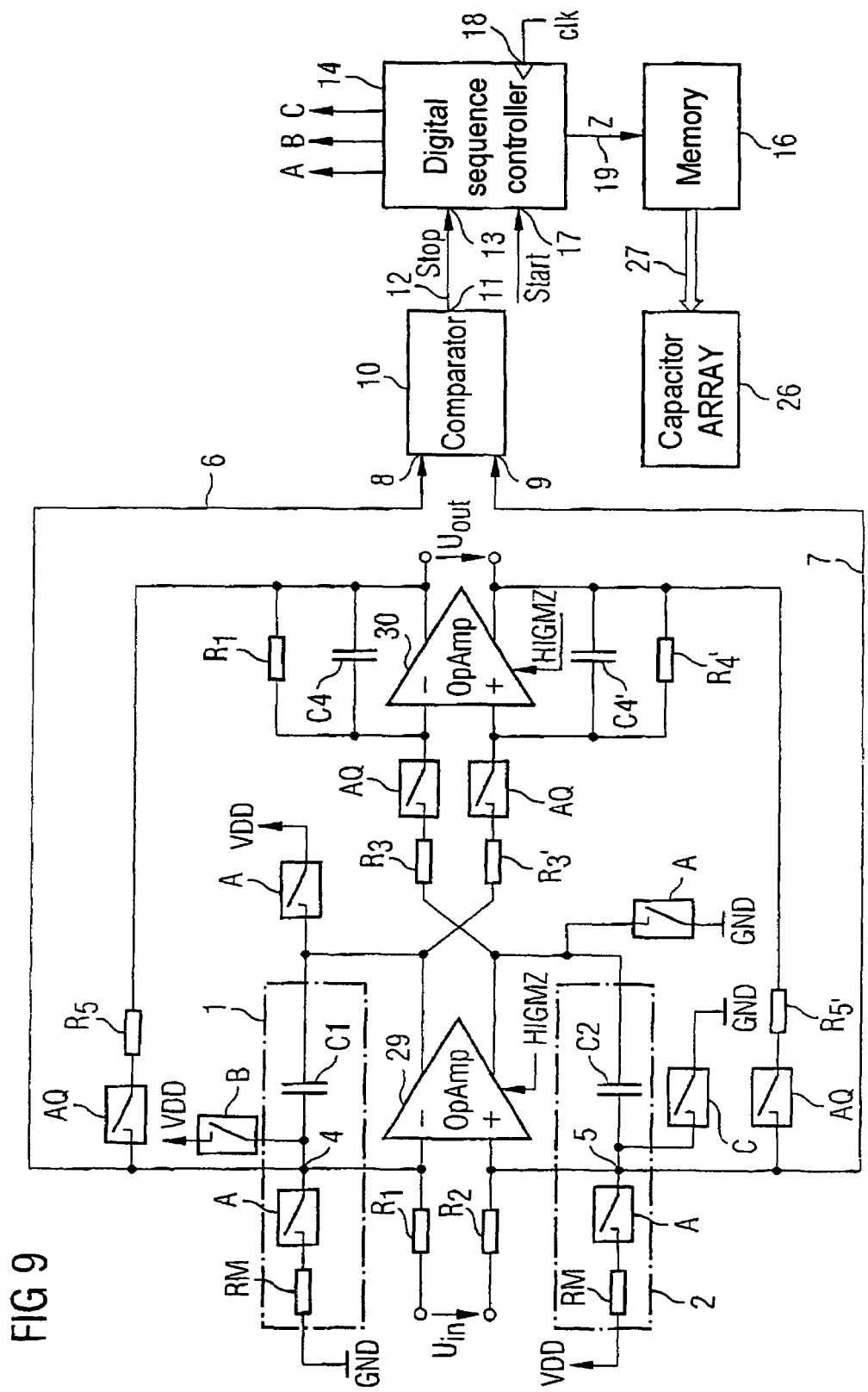
FIG. 9 shows one preferred embodiment of the tuning circuit according to the invention for tuning a biquad filter.

FIG. 9 shows a circuit arrangement according to the invention for tuning a biquad filter. The circuitry of a conventional biquad filter is illustrated in FIG. 2. The biquad filter comprises two filter stages, with each filter stage being completely differential in its own right. In the example illustrated in FIG. 9, the two RC elements, that is to say the RC element 1 and the RC element 2 in the first filter stage of the biquad filter, are tuned by means of the tuning circuit according to the invention. The biquad filter has a first filter stage with a completely differential operational amplifier 29, and a second filter stage with a completely differential operational amplifier 30. The input signal of the filter to be tuned is applied, during normal operation, via resistors R1, R2 to the signal input of the operational amplifier 29. The output signal from the operational amplifier $U_{out}$ is emitted from the signal outputs of the operational amplifier 30 in the second filter stage. The signal outputs of the second operational amplifier 30 are fed back via feedback resistors R5, R5' to the signal inputs of the first operational amplifier 29. The signal inputs of the first operational amplifier 29 are respectively connected to a connecting node 4, 5 for the two RC elements 1, 2. The potential nodes 4, 5 of the two RC elements 1, 2 are connected via lines 6, 7 to the signal inputs of the comparator 10. The digital sequence controller 14 emits three control signals A, B, C. The control signals A, B, C control different switches which are integrated in the biquad filter. These switches are preferably CMOS switches. After reception of a start signal, the digital sequence controller 14 is switched from a normal filter mode to a tuning mode. For this purpose, the digital sequence controller opens all the switches which are annotated AQ in FIG. 9, and at the same time closes all the switches which are annotated A. The opening of the switches AQ disconnects the first filter stage of the biquad filter from the second filter stage. The two differential operational amplifiers 29, 30 are switched to power down. Furthermore, the sequence controller 14 closes the switches that are annotated B, C in FIG. 9. This results in a defined state for the subsequent measurement of the time constants τ. In order to start the measurement process, the sequence controller 14 receives the start signal and opens the switches B, C. The digital counter which is contained in the sequence controller 14 counts the clock signal flanks from this time until the voltages at the potential node 4 and at the potential node 5 have the same magnitude. As soon as the comparator 10 identifies that this is the case, it emits a stop signal to the downstream digital sequence controller 14, and the digital counter which is contained in it stops counting. The measured charge variation time T is a measure of the RC time constant in the first filter stage of the biquad filter. In order to compensate for any possible discrepancy between the RC time constant and a nominal value, the controller switches a capacitor array 26, which is connected in parallel with the capacitors C1, C1', on the basis of the tuning code which is stored in the memory 16.

As can be seen from FIG. 9, apart from the capacitors which are already contained in the biquad filter, the tuning circuit according to the invention does not require any additional measurement capacitors itself in order to tune the biquad filter. The space requirement is thus very small in comparison with conventional tuning circuits. Since, furthermore, there is no need for any reference components located away from the RC elements within the biquad filter for measurement purposes, there are also no matching problems.

After completion of the tuning process, the switches AQ are closed, and the switches A are opened. The filter then continues operation in the normal filter mode. The filter to be tuned has two operating modes, namely the tuning operating mode and the normal operating mode. In the normal mode, the trimming or tuning is switched off. The integrated switches which are additionally provided have no influence on the filter in the normal filter mode.

In the embodiment illustrated in FIG. 9, only the first filter stage is tuned. In alternative, further embodiments, it is also possible to carry out a tuning process for each filter stage. In this case, a specific tuning circuit can be provided for each filter stage, or different filter stages can be multiplexed in order to tune a common tuning circuit.

Figure 10:
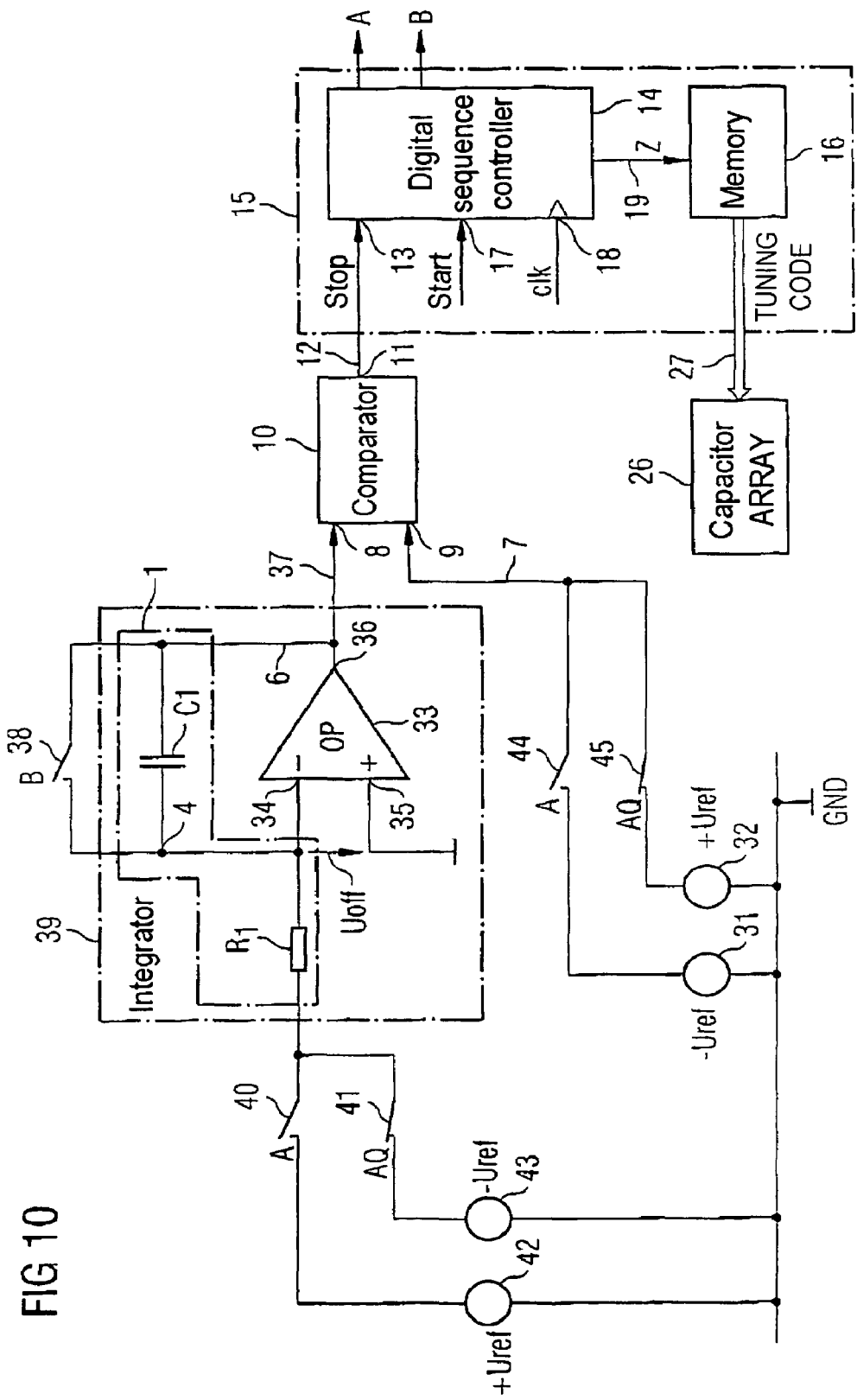
FIG. 10 shows a block diagram of a second embodiment of the tuning circuit according to the invention.

FIG. 10 shows a further embodiment of the tuning circuit according to the invention. The embodiment which is illustrated in FIG. 10 uses fixed reference voltages. The second input 9 of the comparator 10 can be connected via the line 7 and switches A, AQ alternatively to a first reference voltage source 31 or to a second reference voltage source 32. The two reference voltage sources 31, 32 provide reference ground voltages for the comparator 10.

In the embodiment illustrated in FIG. 10, the filter stage to be tuned contains an operational amplifier 33 with a first signal input 34 and a second signal input 35. The inverting signal input 34 in the embodiment illustrated in FIG. 10 is connected to the potential node 4 within the RC element 1. The potential node 4 represents the connecting point between the resistor R1 and the capacitor C1 in the RC element 1. The operational amplifier has a signal output 36 which is connected via a line 37 and the first signal input 8 of the comparator 10. The signal output 36 is fed back via the capacitor C1 in the RC element to the inverting signal input 34. The capacitor C1 can be short-circuited via a switch 38. Together with the RC element 1, the operational amplifier 33 forms an integration circuit 39 within the filter stage to be tuned. The signal input of the integration circuit 39 can be connected via switches 40, 41 alternatively to a first reference voltage source 42 or to a reference voltage source 43. The reference voltage source 42 is preferably identical to the reference voltage source 31, and the reference voltage source 43 is preferably identical to the reference voltage source 32. In the embodiment which is illustrated in FIG. 10, the reference voltage sources 31, 41 produce a positive reference voltage $+U_{ref}$, and the reference voltage sources 32, 43 produce a negative reference voltage source $-U_{ref}$. The reference voltage source 31 can be connected to the second input 9 of the comparator 10 via a switch 44, and the reference voltage source 32 can be connected to the second input 9 of the comparator 10 via a switch 45. The switches 38, 40, 41, 44, 45 are switched by means of the digital sequence controller 14. The switches are preferably integrated CMOS switches.

Figure 11:
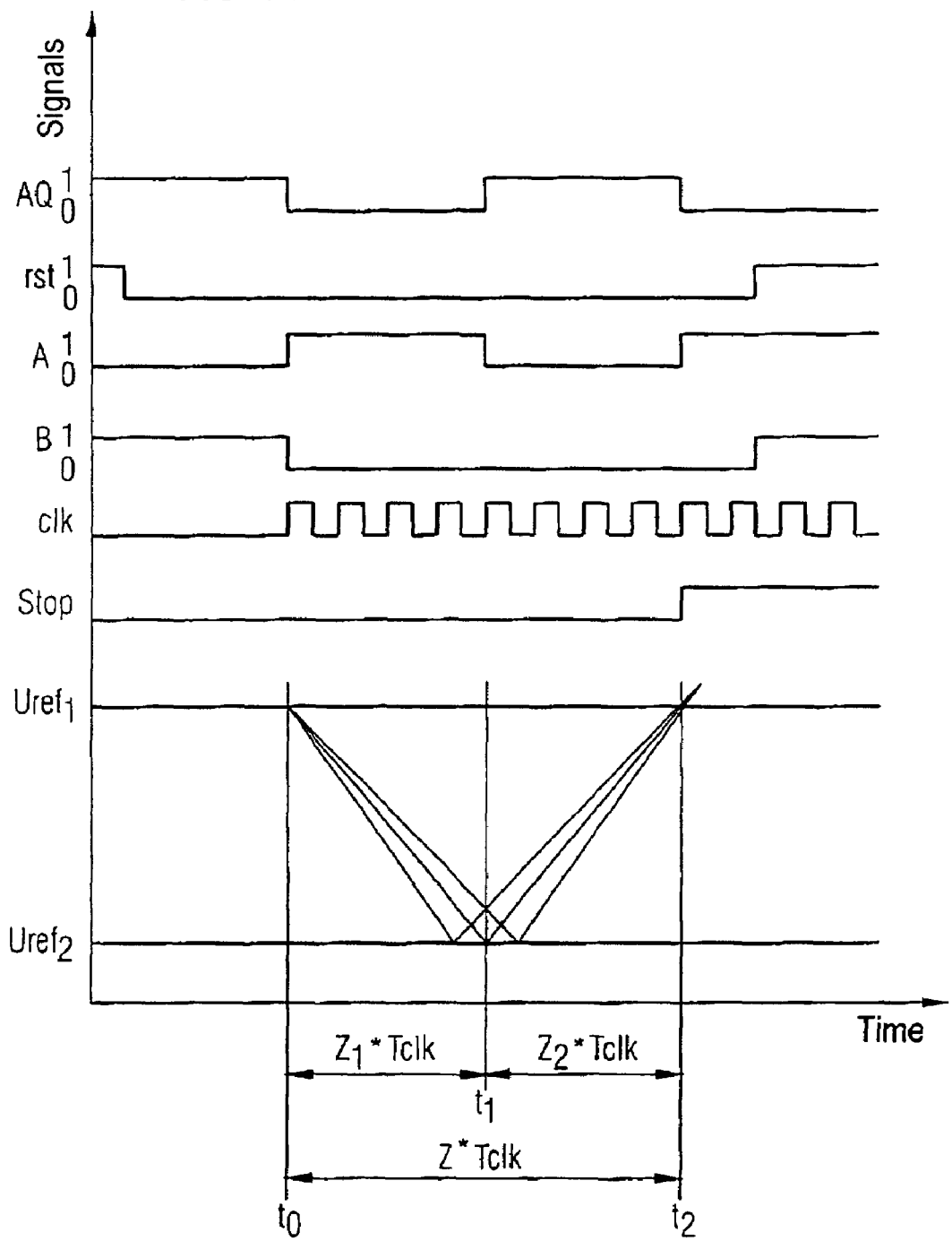
FIG. 11 shows a signal flowchart in order to explain the method of operation of the tuning circuit according to the invention as illustrated in FIG. 10.

FIG. 11 shows signal flowcharts in order to explain the operation of the tuning circuit according to the invention as illustrated in FIG. 10. The digital sequence controller 14 measures the charge variation time for the capacitor C1 between two predetermined reference voltages ($+U_{ref}$, $-U_{ref}$). The time that is measured is the time which the integration circuit 39 requires in order to integrate up to the upper reference voltage ($+U_{ref}$) and then to integrate back down to the first reference voltage ($-U_{ref}$). In order first of all to discharge the capacitance C1 for the measurement, the sequence controller 14 first of all uses a sequence control signal B to close the switch 38. Once the switch B has been opened, the integration circuit 39 continues the integration process until the output voltage at the signal output 36 reaches the voltage value of the negative reference voltage ($-U_{ref}$). For this purpose, the comparator 10 emits a first stop signal or reversal signal to the digital sequence controller 14, which then initiates integration in the direction of the positive reference voltage ($+U_{ref}$), by closing the switch 40 and opening the switch 41. At the same time, the switch 44 is closed and the switch 45 is opened, so that the comparator receives the positive reference voltage $+U_{ref}$ as the comparison voltage at its second signal input 9. The integration direction is switched or reversed at the time $t_1$. The integration in the positive direction continues until the comparator 10 detects that the positive reference ground voltage is reached, at the time $t_2$. The sequence controller 14 uses the clocked counter which is contained in it to measure the total time which is required to vary the charge on the capacitor C1 and to vary the charge on the capacitor in the opposite direction. The total time $$\Delta T=(t1-t0)+(t2-t1)=z1 \times t_{CLK}+z2 \times t_{CLK}=z \times t_{CLK}$$

is recorded as the count Z, and is emitted to the memory unit 16 in order to read the tuning code. The tuning capacitors 28 which are provided in the capacitor array 26 are connected in parallel with the capacitor C1 in the RC element 1 on the basis of the tuning code that is read, in order to compensate for discrepancies resulting from manufacturing tolerances.

FIG. 11 shows the pure offset compensation resulting from the measurement. One advantage of the procedure illustrated in FIGS. 10, 11 is that the influence of offset voltages is compensated for in the measurement of the two integration times, namely the integration time $\Delta t1=t1-t0$ for discharging of the capacitor, and the second integration time $\Delta t2=t2-t1$ for charging of the capacitor. This is because the offset voltage $U_{OFFSET}$ for the first integration process results in a steeper gradient and, after reversal of the integration, in a shallower gradient. The offset voltage $U_{OFFSET}$ is thus added in one integration process, and is subtracted in the opposite direction in the other integration process. The sum of the two integration times $\Delta t1$ and $\Delta t2$ is a measure of the RC time constant of the RC element within the filter.

Figure 12:
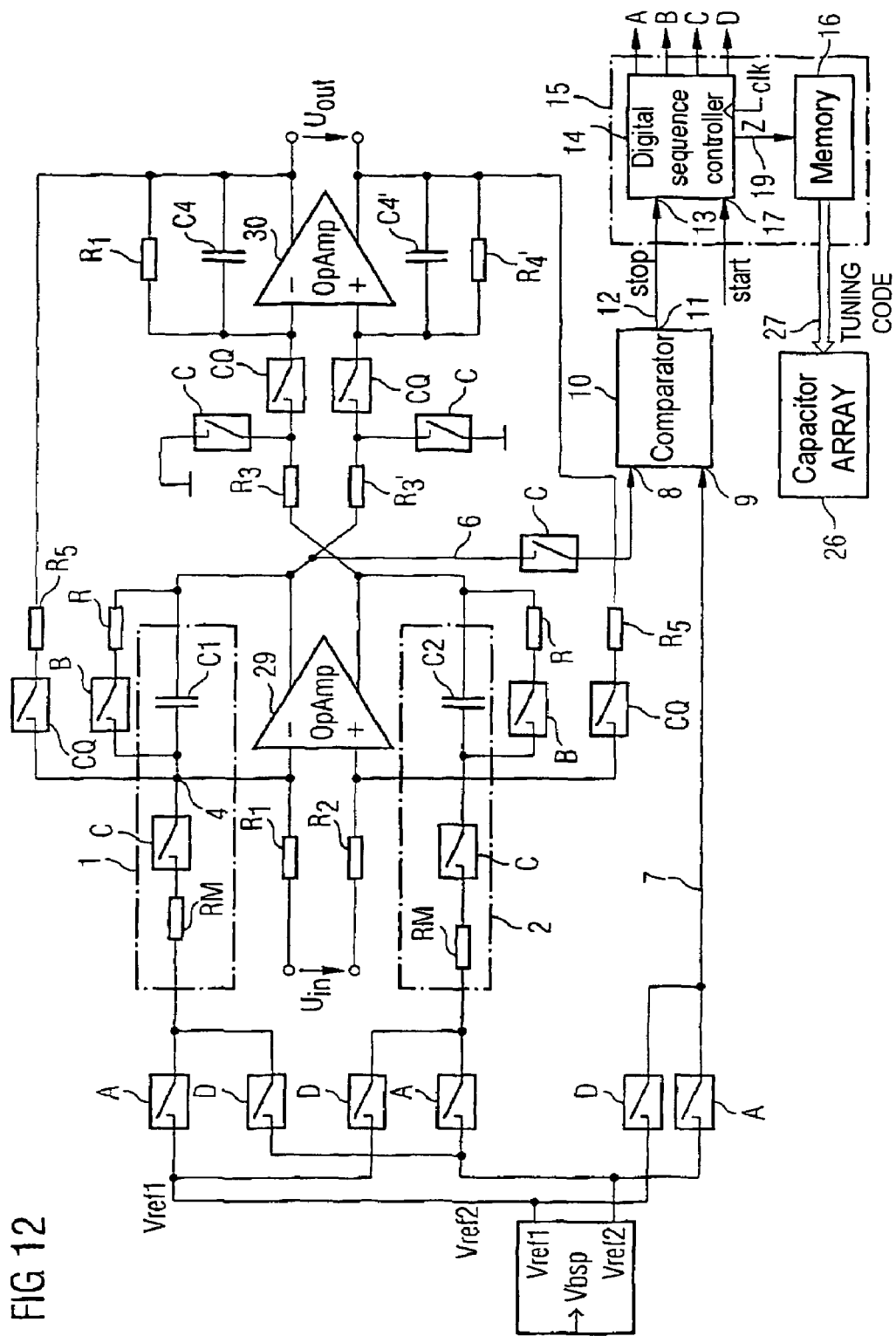
FIG. 12 shows one preferred embodiment of the tuning circuit according to the invention for tuning a biquad filter.

FIG. 12 shows one preferred embodiment of the tuning circuit according to the invention for tuning a two-stage biquad filter. The measurement principle as illustrated in FIG. 10 is used in the tuning circuit as illustrated in FIG. 12. The filter to be tuned is a conventional biquad filter, as is illustrated in FIG. 2, with various switches being integrated in the biquad filter. The switches which are additionally provided are annotated A, B, C, D in FIG. 12.

The switching from the normal filter mode of the biquad filter to a tuning mode is carried out by means of the digital tuning controller, by opening the switches CQ and by closing the switches C. In order to initiate the measurement process, a start signal is emitted to the digital sequence controller 14, which closes the switches A and opens the previously closed switch B. At the same time, the digital counter which is contained in the digital sequence controller 14 is started. The closing of the switch A results in the first reference voltage $U_{ref1}$ being applied via the measurement resistor $R_{MESS}$ to the potential node 4 in the RC element 1. At the same time, the second reference voltage $U_{ref2}$ is applied via a closed switch A to the second signal input 9 of the comparator 10 as a reference ground voltage. The integration circuit integrates the applied first reference voltage $U_{ref1}$ until the integrated voltage at the first signal input of the comparator 10 has precisely the same magnitude as the reference ground voltage $U_{ref2}$. Once this state has been reached, the comparator 10 signals to the digital sequence controller 14 via the control line 12 that the reversal point has been reached, and the sequence controller 14 then opens the switches A and closes the switches D. This now results in the first reference voltage $U_{ref1}$ being applied as the reference ground voltage to the second input of the comparator 10. Furthermore, the second reference voltage $U_{ref2}$ is applied as the input voltage via a switch D to the measurement resistor RM and to the potential node 4, for integration. The integration circuit now integrates in the opposite direction until the reference voltage $U_{ref1}$, which is applied to the input 9, is reached at the comparator input 8. Its state is identified by the comparator 10, which emits a stop signal to the digital sequence controller 14 in order to end the measurement process. The charging time between the time at which the switches A are closed and the initiation of the stop signal by the comparator 10 is recorded by the digital counter as the count Z, and represents a measure of the RC time constant τ of the RC element 1 within the first filter stage. The tuning capacitors which are contained in the capacitor array 26 are switched in accordance with the stored tuning code as a function of the count Z, so that the difference value between the RC time constant and a time constant nominal value $\tau_{NOM}$ is compensated for, in order to tune the filter 3.

What is claimed is:

1. Tuning circuit for tuning a filter stage, wherein the filter stage comprises:
    (a) at least one RC element with an RC time constant, with the RC time constant being the product of the resistance of a resistor and the capacitance of a capacitor which is connected at a potential node to the resistor; and
    (b) an operational amplifier including a first signal input which is connected to the potential node and including a signal output which is fed back via the capacitor to the first signal input of the operational amplifier;
    wherein the tuning circuit comprises:
    (c) a comparator including a first input which is connected to the signal output of the operational amplifier and including a second input which is alternatively connectable to a first reference voltage source which generates a first reference voltage, or to a second reference voltage source which generates a second reference voltage; and
    (d) a controller which is connected to the comparator, the controller including a sequence controller,
    wherein the capacitor has its charge varied by means of switches which are controlled by the sequence controller, until the first reference voltage is applied to the first input of the comparator, and the capacitor then has its charge varied in the opposite direction by means of switches which are controlled by the sequence controller until the second reference voltage is applied to the first input of the comparator,
    wherein a digital counter contained in the sequence controller records a charge variation time for varying the charge of the capacitor;
    (e) wherein the controller switches a capacitor array as a function of the recorded charge variation time, and
    wherein the capacitor array is connected in parallel with the capacitor of the RC element in order to compensate for any discrepancy between the RC time constant of the RC element and a nominal value of the RC time constant.

2. Tuning circuit according to claim 1, wherein the filter stage is contained in an integrated analog filter.

3. Tuning circuit according to claim 1, wherein the switches are CMOS switches.

4. Tuning circuit according to claim 1, wherein the digital counter of the sequence controller is clocked by means of an external clock signal.

5. Tuning circuit according to claim 1, wherein the digital counter for the sequence controller counts a number of clock cycles from the external clock signal between reception of a start signal and reception of a stop signal which is received from the comparator.

6. Tuning circuit according to claim 1, wherein the controller has a memory which is connected to the sequence controller.

7. Tuning circuit according to claim 6, wherein a coded tuning control signal for switching the capacitor array is stored in the memory for each count of the digital counter.

8. Tuning circuit according to claim 7, wherein the capacitor array has two or more tuning capacitors which are connected in parallel with the capacitor in the RC element as a function of the coded tuning control signal.

9. Tuning circuit according to claim 1, wherein the capacitor array is integrated in the filter stage.

10. Tuning circuit according to claim 2, wherein the integrated analog filter is switchable between a normal filter mode and a tuning mode by means of switches which are controlled by the sequence controller.

11. Tuning circuit according to claim 2, wherein the analog filter is an anti-aliasing filter.

12. Tuning circuit according to claim 11, wherein the analog filter is an xDSL anti-aliasing filter.

13. Tuning circuit according to claim 2, wherein the analog filter is a biquad filter.

14. Tuning circuit according to claim 2, wherein the analog filter is a differential analog filter.

15. Tuning circuit according to claim 2, wherein the analog filter has two or more filter stages.

16. Method for tuning a filter stage, the filter stage includes an RC element with an RC time constant, wherein the RC time constant is the product of the resistance of a resistor in the RC element and the capacitance of a capacitor in the RC element, the capacitor is connected in series with the resistor of the RC element, the method comprising:
 (a) varying the charge on the capacitor by at least one RC element in the filter stage;
 (b) measuring the charge variation time until the voltage which is produced at the potential node between the resistor and the capacitor in the RC element reaches a reference voltage;
 (c) switching a capacitor array, which is connected in parallel with the capacitor in the RC element, as a function of the measured charge variation time, in order to compensate for any discrepancy between the RC time constant of the RC element and a predetermined nominal value of the RC time constant; and
 (d) charging the capacitor in the element to a specific first reference voltage before the tuning of the filter stage;
 (e) wherein, in order to tune the filter stage, varying the charge on the capacitor until the voltage which is dropped across the capacitor is equal to a second reference voltage, and it is then charged in the opposite direction until the voltage which is dropped across the capacitor is once again equal to the first reference voltage.

* * * * *